June 3, 1952 H. K. RICHARDS 2,598,722

FREQUENCY MODULATION SYSTEM

Filed Aug. 5, 1948

INVENTOR.
Hans. K. Richards

BY Foorman L. Mueller

Atty

Patented June 3, 1952 2,598,722

UNITED STATES PATENT OFFICE 2,598,722

FREQUENCY MODULATION SYSTEM

Hans K. Richards, Chicago, Ill., assignor to Motorola, Inc., Chicago, Ill., a corporation of Illinois Application August 5, 1948, Serial No. 42,713

8 Claims. (Cl. 332—26)

This invention relates generally to electronic wave modulators and more particularly to a frequency modulating system in which large frequency deviations are produced in a very high frequency oscillator.

In frequency modulation transmitting systems, it is necessary that the center frequency of a carrier wave be held within very close tolerance, and relatively wide frequency deviation of the carrier be produced by the modulating signal. These wide deviations of the carrier are necessary in order to produce a good signal-to-noise ratio in the frequency modulating receivers which are operating with the transmitter. The individual channels in which any signal communication may take place is now limited to provide the large number of channels now required for radio communication. Therefore, in order to provide the maximum deviation and still stay within the authorized channel limits, the carrier center frequency must be held within very close limits.

To meet the above requirements, crystal controlled oscillators are generally used. However, present modulating systems will only provide very small deviation of the carrier frequency and in order to produce adequate deviation for good communication, the carrier frequency must be multiplied many times. This requires a large number of stages and presents difficulties due to the various frequencies which are derived in producing the final transmitting frequency from the original crystal frequency. Therefore, to provide a satisfactory system a large number of vacuum tube stages are required which include highly selective circuits so that all undesired frequencies are carefully eliminated.

It is, therefore, an object of the present invention to provide a simple crystal controlled frequency modulator.

A further object of this invention is to provide a very high frequency, crystal controlled, frequency modulator which produces large frequency deviation so that high orders of multiplication are not required.

A feature of this invention is the provision of a frequency modulator including an oscillator having a crystal controlled feed-back circuit which provides the necessary feed-back for oscillations only when operating within a predetermined frequency range.

A further feature of this invention is the provision of an oscillator including a frequency controlling circuit having reactance which may be varied in accordance with a modulating signal and a second frequency controlling circuit stabilized by a crystal.

Another feature of this invention is the provision of a modulator including an oscillator having a frequency controlling circuit in which the reactance is varied in accordance with the modulating signal by a reactance tube and in which the frequencies of oscillations are limited by a feed-back circuit including a crystal.

A still further feature of this invention is the provision of a crystal controlled oscillator in which the frequency may be shifted through predetermined limits by a reactance tube, with the amplitude of the oscillator being held at a low level so that the reactance tube will be more effective.

Further objects, features and advantages will be apparent from a consideration of the following description taken in connection with the accompanying drawings in which.

In practicing the invention, relatively large deviations in frequency are produced in a very high frequency oscillator having a crystal which in effect limits the frequency range in which oscillations are produced. The oscillator includes a first frequency controlling circuit coupled between the anode and control grid of the oscillator tube which includes a reactance element which can be varied in accordance with the amplitude of a modulating signal. This element may include a reactance tube. The oscillator also includes a feed-back circuit coupled between the anode and cathode thereof which is effective to provide the feed-back required for oscillations only within a predetermined frequency range. This may be accomplished by a crystal, the impedance of which is much lower at the resonant frequency than at other frequencies. Therefore, the amount of feed-back provided will depend upon the frequency of oscillations. The circuit is adjusted so that sufficient feed-back to produce oscillations is provided only within predetermined frequency limits. At high frequencies it may be necessary to neutralize the shunt capacity of the crystal by connecting an inductor across the crystal. Such an inductor has the additional advantage of widening the response band of the crystal feed-back circuit. In order to produce wide frequency deviation of the oscillator center frequency, the amplitude of the oscillations may be held at a low level so that the effect of a reactance tube in the main frequency controlling circuit is accentuated.

Figure 1:
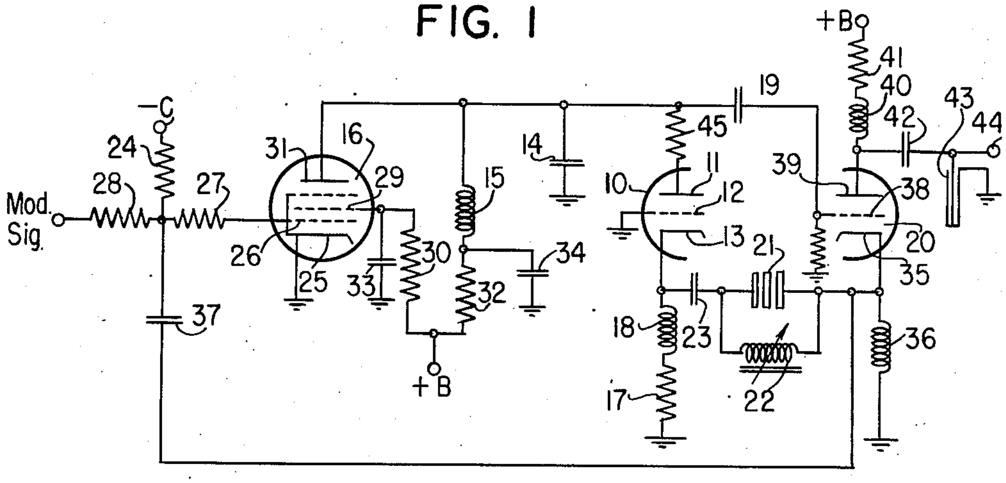
Fig. 1 illustrates one embodiment of the frequency modulator in accordance with the invention.

Referring now to the drawings, in Fig. 1 there is illustrated one embodiment of the frequency modulator in accordance with the invention. The modulator includes a triode oscillator 10 having an anode 11, control grid 12, and cathode 13. The first frequency controlling circuit of the oscillator comprises capacitor 14, inductor 15 and reactance tube 16, all in effect connected in parallel between the anode 11 and the control grid 12. The control grid 12, which is grounded, is biased with respect to the cathode 13 by resistor 17 and inductor 18 connected in series. A feed-back circuit is provided between the anode 11 and cathode 13 including the capacitor 19, the input capacity of tube 20, the crystal 21, which is bridged by inductor 22, and capacitor 23. This feed-back circuit has an impedance which varies with frequency to limit the frequency of oscillations as will be more fully explained.

The reactance tube 16, in effect, varies the inductance of inductor 15 in a well known manner. The reactance tube includes a cathode 25 which is grounded, a control grid 26 to which the modulating signal is applied through resistors 27 and 28, a screen grid 29 connected to plus B through resistor 30 and an anode 31 connected to plus B through inductor 15 and resistor 32. Capacitors 33 and 34 are for radio frequency bypass. A fixed negative bias is applied to the grid 26 from a source of potential —C through resistor 24. Feed-back for the reactance tube is provided from the cathode 35 of tube 20 which has a tuned plate circuit which functions as a frequency multiplier. The feed-back results from cathode follower action which produces a voltage across inductor 36 which is applied to the grid 26 of the reactance tube through capacitor 37 and resistor 27. The output of the oscillator 10 is applied through resistor 45 and condenser 19 to the grid 38 of the tube 20. The output circuit connected to anode 39 includes inductor 40 and resistor 41, connected to plus B. A resonant line 43 is connected to the anode 39 by coupling capacitor 42. The resonant line 43 may be tuned to a harmonic of the crystal frequency and the multiplied frequency derived at the output terminal 44. The triode sections 10 and 20 may obviously be provided in a single tube envelope.

Figure 2:
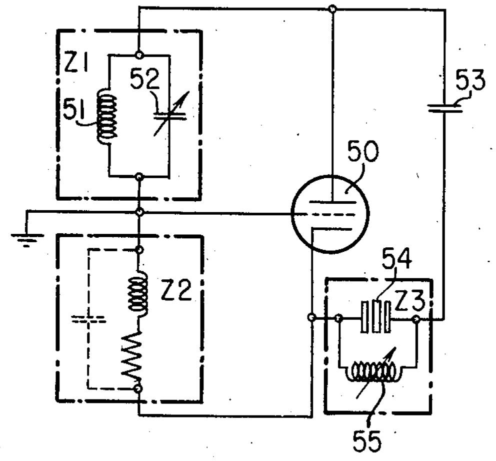
Fig. 2 is a simplified circuit illustrating the principles of the invention.

Considering now the operation of the frequency modulator, reference is made to Fig. 2 which shows a simplified circuit of the oscillator. In this circuit the oscillator tube is designated as 50 and includes a first frequency determining circuit Z1 connected between the anode and control grid, a second frequency determining circuit Z2 connected between the control grid and the cathode and a third frequency determining circuit Z3 connected between the anode and cathode. The circuit Z1 may be used as the frequency controlling circuit of the oscillator, and it is obvious that the frequency of oscillation can be varied by varying either the inductor 51 or the capacitor 52 thereof. The impedance Z2 has relatively little control of the frequency of the oscillator and this impedance may be set at the optimum value for the frequency involved and retained thus.

The impedance Z3 of Fig. 2 is in the feed-back circuit of the oscillator, and oscillations will be produced only when sufficient feed-back is provided between the anode and cathode through the impedance Z3. The impedance Z3 is connected in series with a capacitor 53 which may include the input capacitance of a tube as illustrated in Fig. 1. The impedance Z3 includes a crystal 54 across which the inductor 55 is bridged. The inductor 55 is for the purpose of neutralizing the shunt capacity of the crystal and mounting so that the crystal becomes effectively an inductance and capacitance in series. It is well known that the impedance of a crystal finds its equivalent in a circuit having capacity and inductance in series and shunt capacitance across the series circuit. At very high frequencies, the low reactance of the shunt capacity may permit feed-back producing spurious oscillations. By providing an inductor, such as 55, for tuning the shunt capacitance to the resonant frequency of the crystal, the shunt capacitance is neutralized and this undesired effect is eliminated. The neutralizing inductor is also effective to widen the response band of the crystal as will be fully explained.

It is known that the impedance of a neutralized crystal is low at the resonant frequency of the crystal and harmonics thereof and increases relatively rapidly as the frequency differs from such frequencies. This is illustrated by the curve A in Fig. 3 which shows the impedance of the crystal being a minimum at point $f$ which is the resonant frequency of the crystal and then increasing substantially linearly on each side of the resonant frequency until the anti-resonant frequencies are approached where the crystal impedance increases sharply. The difference between the resonant and anti-resonant frequencies of the crystal is proportional to the ratio of the series capacity of the crystal to the shunt capacity. When the crystal is neutralized, the difference between the resonant and anti-resonant frequencies is proportional to the square root of this ratio. As the ratio of series to shunt capacitance of the crystal is of the order of one-hundredth to one-thousandth, the square root is larger than the ratio and therefore the frequency difference when the crystal is neutralized is greater. It is to be pointed out that only a portion of the frequency difference between the resonant and anti-resonant frequencies can be used, but neutralization is effective to increase this frequency range. Curve A shows the absolute value of the impedance without reference to whether it is inductive or capacitative. It is, therefore, seen that the feed-back circuit including impedance Z3 will permit the feed-back required for producing oscillations only within a limited frequency range.

Figure 3:
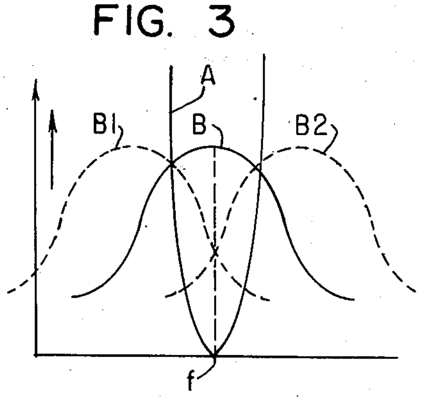
Fig. 3 is a chart illustrating the operation of the system.

Curve B in Fig. 3 also illustrates the impedance of Z1 with varying frequency. The curve B is, in effect, shifted when the impedance Z1 is changed as by varying the inductor 51 or the capacitor 52, as illustrated by curves B1 and B2. Varying the impedance of Z1, therefore, changes the frequency of the oscillator, or in other words, frequency modulates the wave produced by the oscillator. The impedance of Z1 may be shifted in any suitable manner as by the use of a reactance tube across the inductor 51 and capacitor 52 as shown in Fig. 1. However, other means for varying the reactance of the element might be used as, for example, the use of a condenser microphone in the Z1 circuit.

It will be apparent from Fig. 3 that variation of the frequency of the oscillator by varying Z1 is limited to the range of frequencies in which the impedance of the crystal 54 is such that the necessary feed-back is provided. This provides adequate control of the oscillator frequency so that the oscillator is very stable. Calculations and tests have indicated a stability about 100 times better than in oscillators not including a crystal. It is, therefore, seen that the oscillator will work within limits where the crystal impedance is low enough to permit sufficient feed-back and the impedance of Z1 is high enough to provide a sufficient voltage between the anode and the grid that such feed-back can be provided. When the frequency at which the impedance of the crystal is a minimum is different from the frequency at which Z1 is a maximum, a compromise value will be reached, but if the frequency of Z1 differs too much from the resonant frequency of the crystal, oscillations will stop. The impedance Z2 should be high so that the current passing through Z2 produces enough feed-back voltage.

Referring again to Fig. 1 and the operation of this circuit, it is apparent that the condenser 14, inductor 15 and reactance tube 16 comprise the impedance Z1 of Fig. 2. These elements in parallel establish the frequency of the oscillator 10 within limits where sufficient feed-back is provided through the crystal 21. In actual operation a crystal operating at 10 megacycles has been used and the frequency of the oscillator is set at the third harmonic of the crystal or 30 megacycles. As previously stated, the neutralized crystal will have a minimum impedance at the harmonic frequencies as well as the fundamental. As the crystal has the effect of stiffening the control of the oscillator, the resistor 45 is provided to cut down the amplitude of the oscillations so that the change in the impedance Z1 produced by the reactance tube will be effective to provide relatively large frequency deviation. Deviations of the 30 megacycle wave of the order of 10 kilocycles have been produced and, by multiplying this five times in the tube 20, a 150 megacycle wave having a deviation of 50 kilocycles was produced. Highly satisfactory operation of the reactance tube resulted by providing feed-back therefor from the cathode of the multiplier stage. This arrangement provides minimum loading of the tuned circuit and thereby produces a larger voltage swing which in turn produces more deviation. This feed-back system together with the reduction of amplitude of the oscillations by the resistor 45 makes the reactance tube highly effective to control the circuit which is made very stiff by the crystal.

It is, therefore, seen that accurately controlled frequency modulation having a sufficiently wide swing is produced in a very simple system. The crystal provides sufficiently good control of the oscillator frequency that the transmitting carrier frequency is held within the required limits and interference with adjacent channels is substantially eliminated. The required deviation is produced without a plurality of multiplier stages so that the equipment is simplified and radiation at undesired frequencies is eliminated. The system is not unduly critical of adjustment and provides reliable operation.

While one embodiment of my invention which is illustrative thereof has been described, it is obvious that various changes and modifications can be made therein without departing from the intended scope of the invention as defined in the appended claims.

I claim:

1. A frequency modulation system comprising an oscillator, a frequency controlling circuit for said oscillator including variable reactance means, means for varying the value of said reactance means in accordance with the amplitude of a modulating signal so that the frequency of said oscillator deviates from a center frequency in accordance with the amplitude of the modulating signal, and a feedback circuit for said oscillator separate from said frequency controlling circuit, said feedback circuit including a vacuum tube and a parallel circuit including a piezoelectric crystal and inductance means bridged thereacross, with said tube having an input electrode coupled to said frequency controlling circuit and having an output electrode coupled through said parallel circuit to said oscillator for holding the center frequency of the oscillator within predetermined limits.

2. A frequency modulation system comprising an oscillator, a frequency controlling circuit for said oscillator including variable reactance means, means for varying the value of said reactance means in accordance with the amplitude of a modulating signal so that the frequency of said oscillator deviates from a center frequency in accordance with the amplitude of the modulating signal, and a feedback circuit for said oscillator separate from said frequency controlling circuit, said feedback circuit including a vacuum tube and a series resonant element, with said tube having an input electrode coupled to said frequency controlling circuit and having an output electrode coupled through said series resonant element to said oscillator for holding the center frequency of the oscillator within predetermined limits.

3. A frequency modulation system comprising an oscillator, a frequency controlling circuit for said oscillator including a reactance tube, means for varying the effective reactance of said tube in accordance with the amplitude of a modulating signal so that the frequency of said oscillator deviates from a center frequency in accordance with the amplitude of the modulating signal, and feedback means for said reactance tube and said oscillator including a cathode follower coupled on the input side thereof to said frequency controlling circuit, with said cathode follower being coupled on the output side thereof to the input side of said reactance tube, said feedback means including also a piezoelectric crystal coupling the output side of said cathode follower to said oscillator for limiting the variations of the oscillator center frequency.

4. A frequency modulation system comprising an oscillator including an electron discharge valve having a cathode, an anode and a grounded grid, a frequency controlling circuit coupled to the anode of said oscillator valve, said frequency controlling circuit including variable reactance means and means for varying the value of said reactance means in accordance with the amplitude of a modulating signal so that the frequency of said oscillator deviates from a center frequency in accordance with the amplitude of the modulating signal, and a feedback circuit for said oscillator including a second electron discharge valve and a piezoelectric crystal, with said second valve having a control grid coupled to said frequency controlling circuit and having a cathode coupled through said crystal to the cathode of said oscillator valve for holding the center frequency of the oscillator within predetermined limits.

5. A frequency modulation system comprising an oscillator, a frequency controlling circuit for said oscillator including variable reactance means, means for varying the value of said reactance means in accordance with the amplitude of a modulating signal so that the frequency of said oscillator deviates from a center frequency in accordance with the amplitude of the modulating signal, a frequency multiplier including a vacuum tube having an input electrode coupled to the output side of said oscillator, said multiplier tube also having an output electrode, and feedback coupling means for said oscillator including a piezoelectric crystal coupling the output electrode of said multiplier tube to said oscillator.

6. A frequency modulation system comprising an oscillator including an electron discharge valve having a cathode, an anode and a grounded grid, a frequency controlling circuit coupled to the anode of said oscillator valve, said frequency controlling circuit including variable reactance means and means for varying the value of said reactance means in accordance with the amplitude of a modulating signal so that the frequency of said oscillator deviates from a center frequency in accordance with the amplitude of the modulating signal, a frequency multiplier including a second electron discharge valve having a control grid coupled to the anode of said oscillator valve and also including an anode and a cathode, and feedback means for said oscillator including a piezoelectric crystal coupling the cathode of said multiplier valve to the cathode of said oscillator valve, said crystal having the properties of a series resonant element at the desired center frequency of said oscillator for limiting the variations of such center frequency.

7. A frequency modulation system comprising an oscillator including an electron discharge valve having at least a cathode, an anode and a control grid, a frequency control circuit coupling said anode and said control grid, and a feedback circuit coupling said anode and said cathode, said feedback circuit including a second electron discharge valve having at least a control grid and a cathode and also including an impedance element having the property of a series resonant circuit at a particular frequency, with the grid of said second valve being coupled to said frequency controlling circuit, and the cathode of said second valve being coupled through said impedance element to the cathode of said oscillator valve for causing the frequency deviations of said oscillator to be symmetrical with respect to said particular frequency.

8. A frequency modulation system comprising an oscillator, a frequency controlling circuit for said oscillator including variable reactance means, means for varying the value of said reactance means in accordance with the amplitude of a modulating signal so that the frequency of said oscillator deviates from a center frequency in accordance with the amplitude of the modulating signal, a frequency multiplier responsive to the output of said oscillator for furnishing a desired harmonic of the oscillator frequency, said oscillator and said multiplier respectively including electron tubes having cathode circuits in which alternating voltages are developed, and feedback means for said oscillator coupling said cathode circuits together, said feedback means including an impedance element having the property of a series resonant circuit at the desired center frequency of said oscillator.

HANS K. RICHARDS.

REFERENCES CITED

The following references are of record in the file of this patent:

UNITED STATES PATENTS

| Number | Name | Date |
|---|---|---|
| 2,298,438 | Usselman | Oct. 13, 1942 |
| 2,316,927 | Winlund | Apr. 20, 1943 |
| 2,343,099 | Usselman | Feb. 29, 1944 |
| 2,438,392 | Gerber | Mar. 23, 1948 |